United States Patent
Balz et al.

(10) Patent No.: US 6,207,330 B1
(45) Date of Patent: Mar. 27, 2001

(54) FORMATION OF PUNCH INSPECTION MASKS AND OTHER DEVICES USING A LASER

(75) Inventors: James Gregory Balz, Maybrook; Mark William Kapfhammer, Fishkill; Mark Joseph LaPlante, Walden; David C. Long, Wappingers Falls, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/281,515

(22) Filed: Mar. 30, 1999

Related U.S. Application Data

(62) Division of application No. 08/892,558, filed on Jul. 14, 1997, now Pat. No. 5,958,628.

(51) Int. Cl.$^7$ .................................................. G03F 9/00
(52) U.S. Cl. ............................... 430/13; 430/11; 430/17; 430/5; 430/495; 216/94
(58) Field of Search .................................. 430/5, 18, 945, 430/271.1, 318, 11, 12, 17, 13; 216/94

(56) References Cited

U.S. PATENT DOCUMENTS

| | | |
|---|---|---|
| 3,720,143 | 3/1973 | Hashimoto et al. . |
| 3,808,751 | 5/1974 | Usui . |
| 3,975,252 | 8/1976 | Fraser et al. . |
| 4,340,654 | 7/1982 | Campi . |
| 4,490,211 | 12/1984 | Chen et al. . |
| 4,578,329 | 3/1986 | Holsappel . |
| 4,718,767 | 1/1988 | Hazama . |
| 4,854,696 | 8/1989 | Guez . |
| 5,168,454 | 12/1992 | LaPlante et al. . |
| 5,376,314 | 12/1994 | Share . |
| 5,958,628 | * 9/1999 | Balz et al. ............................. 430/5 |

FOREIGN PATENT DOCUMENTS

| | | |
|---|---|---|
| 1-224186 | 9/1989 | (JP) . |
| 5-15987 | 1/1993 | (JP) . |

OTHER PUBLICATIONS

Technical Disclosure Bulletin vol. 17, No. 8, Jan. 1975, "Laminate Fabrication to Facilitate Laser Hole Drilling", Haining et al.

SPIE, vol. 247, Advances in Laser Engineering and Applications, 1980, "Neodymium–Yttrium–Aluminum Garnet (Nd: YAG) Laser Marking System", Hansen.

Kenneth Mason Publications, Ltd., England, No. 269, Sep. 1986, "High Resolution Molybdenum Masks by Laser Etching".

* cited by examiner

*Primary Examiner*—Thorl Chea
(74) *Attorney, Agent, or Firm*—DeLio & Peterson LLC; John J. Tomaszewski; Ira D. Blecker

(57) ABSTRACT

Exposure masks and inspection masks for use in the electronics field may be made using laser beams wherein the mask comprises a substrate which is substantially unaffected by exposure to the laser beam and an opaque pattern forming layer on the substrate, which pattern forming layer absorbs the laser beam and is selectively etched when exposed to the laser beam. A preferred mask has an overcoat transparent layer. A cavity inspection mask is provided having a series of openings in the form of lines formed in the opaque pattern forming layer, the lines bounding the cavity walls, is the mask being used for determining if the cavity is centrally positioned on the substrate and/or that the cavity is of the desired size. Substrates containing identifying masks thereon which cannot be seen by the unaided eye for theft deterrence are also provided.

7 Claims, 4 Drawing Sheets

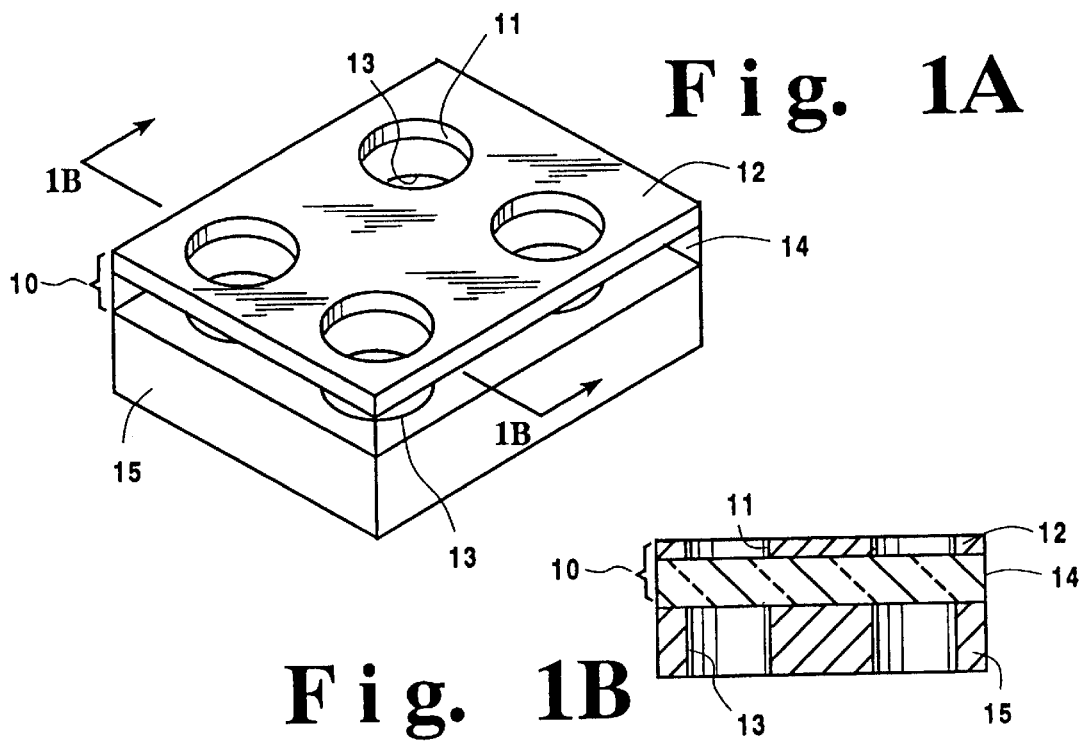
Fig. 1A
Fig. 1B
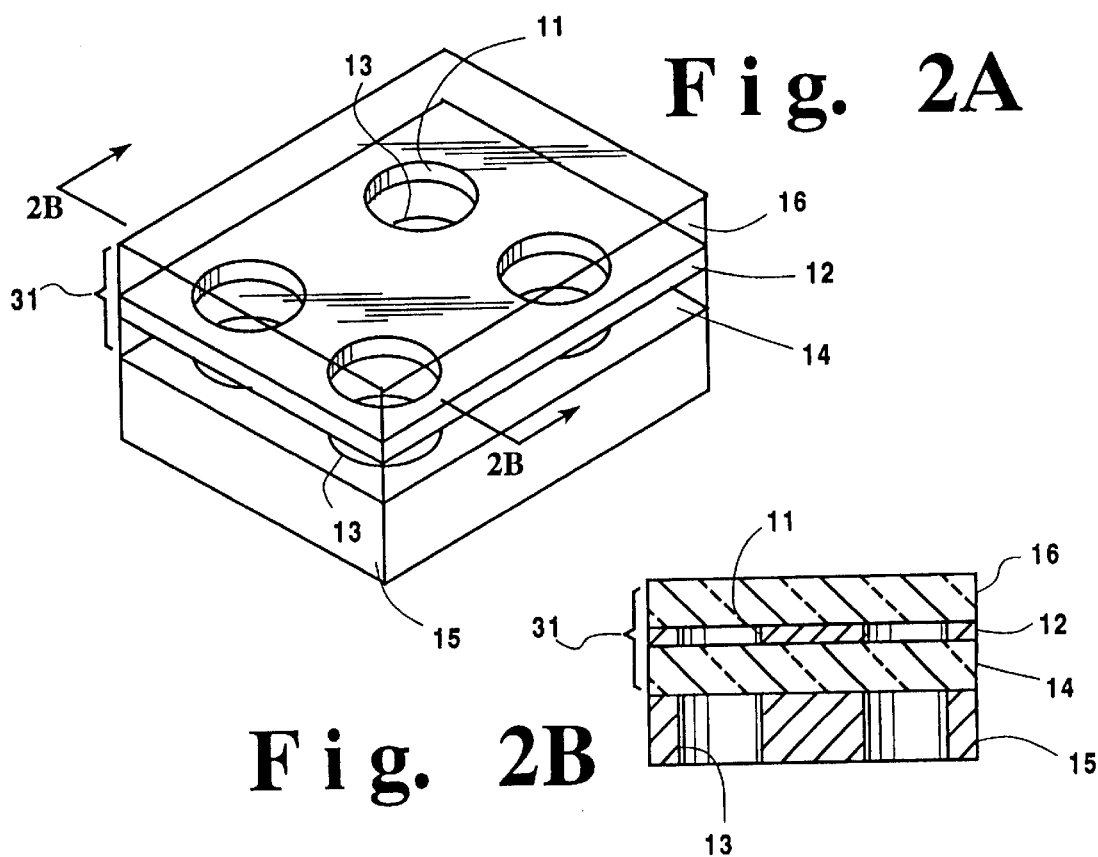
Fig. 2A
Fig. 2B

FORMATION OF PUNCH INSPECTION MASKS AND OTHER DEVICES USING A LASER

This is a divisional of application(s) Ser. No. 08/892,558 filed on Jul. 14, 1997, U.S. Pat. No. 5,958,628.

BACKGROUND OF THE INVENTION

1. Field of the Invention

The present invention relates to a method for making masks using lasers and in particular to exposure masks and punch inspection masks made using lasers.

2. Description of Related Art

Masks are substrates having a defined pattern thereon and are used in a number of industrial applications in a wide variety of fields. The electronics field uses masks extensively to make printed circuit boards and integrated circuits and the different masks employed are generally categorized as exposure or photo masks, screening masks and inspection masks.

For making integrated circuits (IC) on a silicon chip, the initial design and layout of an IC are carried out on a scale several hundred times larger than the final desired dimensions of the circuit pattern. The initial layout of an IC is normally done on a magnification scale in a range of 250:1 to 500:1 and the layout is a composite of different mask patterns corresponding to the different masking steps associated with the fabrication process. Each mask pattern is cut into a dimensionally stable plastic laminate layer, called a Rubylith, which consists of a clear Mylar base with a pealable opaque ruby overlay. The overlay can be cut with a sharp knife and removed to form clear areas in the opaque overlay. Photographic techniques are then used to reduce each of these base layers to the final circuit dimensions. This is a time consuming, labor intensive and costly process.

During the masking operation, the wafer surface to be masked is coated with a photosensitive coating known as a photoresist or resist. The exposure mask is then placed on the surface of the wafer and exposed with ultraviolet light. Depending upon whether a negative-active resist or a positive-active resist is used, a pattern is formed on the photoresist layer on the wafer by the ultraviolet light and the exposed wafer is developed in a number of steps with liquid solvents to form the desired pattern on the wafer. A similar process is used to form circuit patterns on printed circuit boards using an exposure mask, exposure to ultraviolet light and developing of the exposed photoresist layer.

In other electronic applications such as in the manufacturing of multi-layered ceramic (MLC) packaging for semiconductor electronic circuits, green (unfired) ceramic sheets are formed by a well known doctor blade process. These greensheets are typically punched by mechanical means using various methods as well as by laser and Electron-beam equipment. The resulting holes (VIAS) are subsequently filled with conductive materials and the greensheets patterned to produce a desired electrical conductive path. The individual greensheets are precisely stacked one upon another, and laminated under high pressure to form a green laminate. The laminate is then cut to the desired size and sintered in a kiln to form the finished ceramic substrate ready for further processes if desired.

It is extremely important that the punched vias are accurately placed in the greensheet so that the vias align precisely to the screening mask so that the metal paste fills them completely and that screened patterns do not short to the non-aligned vias. To ensure that the vias are properly placed, a punch inspection mask is typically used. These inspection masks are employed to visually verify that the punch data used to punch the sheets is correct and also to debug the punch device for certain products as well as ensuring that the correct shrinkage has been applied when creating the data sets.

These masks are now fabricated using process steps similar to those used to fabricate thick film screening masks using a photolithographic process where art work is generated on masters and subsequent photo expose/develop processes performed to make the mask. This process is expensive and it requires a relatively long time to make each mask. A typical process for making masks is shown in U.S. Pat. No. 3,720,143.

Research Disclosure, September 1986, No. 269, shows high resolution molybdenum screening masks made using a laser etching process. The thin molybdenum masks usually 2 mils thick are used as templates through which metal paste is screened onto ceramic green sheets to form conductive lines after lamination and sintering. The article discusses forming these type masks using conventional wet lithographic processes and the masks limitations in being able to form lines only as small as 3 mils wide. Using laser etching however, features as small as 10 microns can be etched through the 2 mil molybdenum sheets and typical results for 1–2 mil wide slots can be etched with a separation as little as 3 mils. The laser burns the molybdenum metal in air and oxidizes the molybdenum to $MoO_3$ which is volatile at the elevated process temperatures. Recrystallized $MoO_3$ debris can be removed mechanically or by dissolution in a variety of solvents.

Laser processes have been used extensively for marking materials with letters, numbers, special symbols and company logos. A "Neodymium yttrium aluminum garnet (Nd:YAG) laser marking system" is shown in SPIE Vol. 247, Advances in Laser Engineering and Applications (1980) pages 18–23. The laser marking system is controlled by a microprocessor and is composed of three fundamental components: 1) a laser that emits pulses of radiation on command, 2) an optical train to direct and focus that radiation to a spot on the workpiece and 3) electronic circuitry to control the optical system and fire the laser at appropriate times. The electronic circuitry is organized around an 8085 microprocessor and allows the operator to directly enter the information to be marked. Marking is done on a variety of substrates such as plastics by heating the plastic so it decomposes and changes color providing a high contrast mark. Marking is also shown on transparent materials using a proprietary process which produces highly visible masks on transparent materials. It is cautioned that the use of high laser energy can damage the transparent material and cause localized in homogeneities which result in sporadic, inconsistent marks. Marking of painted surfaces is also disclosed to provide a contrast with the host material substrate.

Laser marking is shown in U.S. Pat. No. 4,578,329 wherein a laser radiation absorbing substance is incorporated into a plastic to absorb the laser beam and decompose the plastic forming the desired marks. Japanese No. 1224186 shows a mask for laser marking having a patterned metal layer on a polyolefin layer and radiating a laser beam onto the surface to be marked through the mask.

U.S. Pat. No. 4,340,654 shows a process for repairing transparent defects in photomasks by applying a coating material which absorbs radiant energy over the transparent defect and fusing the material to the substrate with a laser forming an opaque layer and eliminating the transparent defect in the mask.

Through-holes are shown formed in a plastic sheet in Japanese 515987 by using a metal foil mask over the sheet and drilling the through-holes using a laser beam by repetitive irradiation through the mask openings.

Bearing in mind the problems and deficiencies of the prior art, it is therefore an object of the present invention to provide a laser method for making masks, and in particular inspection masks and exposure masks, useful in a number of applications especially electronic applications, which method is inexpensive and cost effective.

It is another object of the present invention to provide inexpensive and cost effective masks, in particular inspection masks and exposure masks, made by a laser process which may be used for a variety of electrical applications.

A further object of the invention is to provide inexpensive and cost effective inspection masks having a special pattern thereon made by a laser process to enable the user of the mask to easily and effectively determine if a cavity such as a via or a line in a substrate is within specification for size and/or position (centrality) on the substrate being inspected.

Still other objects and advantages of the invention will in part be obvious and will in part be apparent from the specification.

SUMMARY OF THE INVENTION

It has been discovered that Mylar, quartz glass and other such transparent materials may be coated with a thin opaque or substantially opaque pattern forming material layer and the opaque or substantially opaque coating selectively etched with high precision and at varying pattern dimensions to make inspection masks and exposure masks using a laser beam with, for example, a scanning laser tool apparatus. For convenience, the term "opaque " when used herein will mean opaque and substantially opaque. The mask pattern forming layer is a material which absorbs the laser beam and which is selectively etched from the transparent material without any significant etching or deleterious effect to the transparent material. Generally, the thickness of the mask forming layer is about 10 Å to 25 µm (micrometer), preferably 100 Å to 1000 Å for aluminum, for example. A single laser pulse is preferred to etch the opaque layer at the point the laser is directed and it is important that the type and thickness of the laser beam used, the type opaque material and thickness thereof and the transparent substrate used be correlated to provide the desired selective etch. Using laser techniques on such coated substrates, inspection masks and exposure masks and other such masks may be produced directly from design data in a computerized single step process as compared with processes such as a photolithography and developing process where many steps and numerous chemical solvents are required. The masks produced using this method are inexpensive and cost effective and may be easily produced in a relatively short time, compared with conventional mask making processes.

In a preferred embodiment, a mask is produced by forming a layered mask structure comprising a first substrate layer which is a transparent material which is substantially unaffected by a laser beam, a second substrate layer which is a transparent material which is substantially unaffected by a laser beam and an opaque mask pattern forming layer intermediate the first substrate layer and second substrate layer, the opaque mask pattern forming layer being a material which absorbs a laser beam and which is selectively etched and forms the desired mask pattern when a laser beam is directed at the layered mask structure. It is preferred that the first substrate layer and second substrate layer be the same material, such as Mylar.

In another aspect of the invention, an inspection mask is prepared by forming circular patterns on the mask which correspond to via openings in an electrical component substrate and which mask can then be used as a via inspection mask by placing the mask on the electrical component and visually verifying the position and size of the via openings.

In a further aspect of the invention the laser beam can be used to form continuous line patterns in the mask corresponding to cavities (having line boundaries) in a substrate to be inspected and the inspection mask used to inspect for part tolerance.

In yet another aspect of the invention, the laser beam produces minute patterns, small enough so that they cannot be seen with the un-aided eye. Labels containing these patterns can be placed on items wherein the patterns form hidden identification marks such as serial numbers, logo's, lot numbers, product code numbers, bar codes, etc. so that the labeled items can be identified when otherwise visible identification marks have been removed or otherwise altered.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1A is a magnified partial perspective view of a via inspection mask of the invention, positioned on a substrate containing vias which is to be inspected.

FIG. 1B is a cross-sectional view of FIG. 1A taken along lines 1B—1B.

FIG. 2A is a magnified partial perspective view of a punch inspection mask of the invention having a protective overcoat and positioned on a substrate to be inspected.

FIG. 2B is a cross-sectional view of FIG. 2A taken along lines 2B—2B.

FIG. 5A' is a cross-sectional view of FIG. 5A taken along lines 5A'—5A'.

DESCRIPTION OF THE PREFERRED EMBODIMENT(S)

Figure 3:
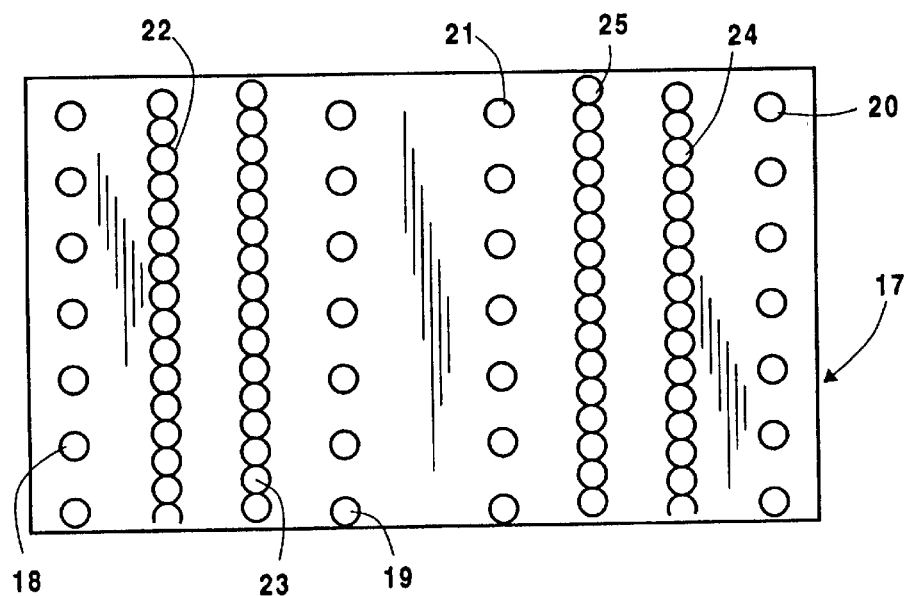
FIG. 3 is a top magnified view of a preferred cavity inspection mask of the invention.

In describing the preferred embodiment of the present invention, reference will be made herein to FIGS. 1–5D of the drawings in which like numerals refer to like features of the invention. Features of the invention are not necessarily shown to scale in the drawings.

Referring to FIG. 1A, a via inspection mask is shown as 10. The mask 10 comprises a transparent substrate 14 having thereon an opaque pattern forming layer 12. Via inspection openings 11 in the opaque layer 12 are shown. These openings 11 are formed by etching of the opaque layer using a laser beam. The via inspection mask 10 is shown overlaying a substrate 15 containing corresponding via openings 13, which substrate is to be inspected for proper positioning of the vias and the size of the via openings on the substrate.

FIG. 1B is a cross-sectional side view of FIG. 1A along lines 1B. Via inspection mask 10 comprises a pattern forming layer 12 and a Mylar transparent substrate layer 14. Other transparent substrates such as glass, Quartz, mica, plastics, etc. may be used. Via inspection openings are shown as 11. The via inspection mask 10 is positioned on top of via containing substrate 15 which has corresponding via openings 13.

When using a via inspection mask 10, the mask is positioned on the substrate to be inspected and by visual or other means the pattern on the substrate can be inspected and verified. If, for example, a mask via opening 11 is not in registration with a corresponding substrate via openings 13, the substrate 15 is considered defective.

The opaque layer coating 12 on the mask substrate 14 is a material which is strongly absorbent to the laser beam wave length employed to make the mask. The opaque material used will be dependent on the laser wavelength used and for a green laser light, which may be the second harmonic of Nd:YAG, berrylium, aluminum, chromium, copper, carbon and certain paints may be suitably used. An opaque layer thickness of about 10 Å to 25 $\mu$m preferably, about 100 Å to 1000 Å may suitably be employed.

The substrate material must be transparent and substantially unaffected by the laser beam during the etching process. Any significant discoloration or other blemishing of the substrate by the layer beam will damage the mask and render it useless. Preferred transparent substrate materials are Mylar and quartz glass and Melinex.

It is highly preferred that the mask be made by utilizing a single laser beam pulse at the point on the opaque layer which is to be selectively etched. A single pulse provides a high degree of mask accuracy and minimizes any mask defects. In a preferred method, an aluminized Mylar sheet is placed on a work holder with the aluminized side up. The laser beam is the second harmonic of Nd:YAG and is focused to correspond to the diameter of the via to be inspected. The fluency of the beam is adjusted so that it is below the melting joint of the Mylar, and the laser is then activated to provide each desired via inspection position with a single pulse to produce the inspection mask. The thickness of the transparent substrate layer 14 may vary widely, e.g., 0.0005 inch to 0.125 inch whereas the thickness of the opaque forming layer 12 is preferably controlled to allow selective etching of the opaque layer with preferably a single laser pulse. Multiple laser pulses may be used for each via or point etched up to about several hundred but a single laser pulse is highly preferred. An aluminum opaque layer thickness of about 10 Å to 5000 Å, preferably 100 Å to 1000 Å has been found to be satisfactory for using a single laser pulse process.

As will be appreciated by those skilled in the art, the type opaque material used, the thickness of the opaque material, the laser beam used and the fluency and size of the laser beam must be correlated to enable making of masks inexpensively while still being reliable.

FIG. 2A shows a preferred via inspection mask 31 comprising a top Mylar layer 16, a middle opaque layer 12 and a lower Mylar layer 14. Via inspection openings 11 correspond to via containing substrate 15 having via openings 13 which substrate is being inspected. FIG. 2B is a cross-sectional view of FIG. 2A along lines 2B. Via inspection mask 31 comprises Mylar layers 16 and 14 with intermediate opaque layer 12. Inspection mask via openings 11 are shown registered with via openings 13 in substrate 15 being inspected.

The advantage of forming such a structure 31 is that the transparent overcoat 16 protects the metalized layer 12 from damage due to handling and abrasion. Note, however that it has been found that inspection masks can still be fabricated in the same manner as in the first embodiment described above. The thin metal layer 12 melts back in the area irradiated by the laser beam leaving a clear aperture interposed between the transparent overcoat layer 16 and the transparent substrate 14.

It has been found that lasers can easily and reliably form mask openings in the overcoated structure in the size range from less than 1 micron to greater than 450 microns in diameter. For inspection masks, the preferred opening diameter is about twice that of the punched via diameter. For example, a 100 micron via would preferably have an inspection mask opening of 200 microns. This provides ease of alignment to the punched sheet while still allowing a high degree of placement tolerance.

A particularly important use of an overcoated metalized layer especially when used with laser formed openings in the range of 1 micron to 8 microns in diameter would be in the field of product labeling. In these applications, marks could be included on labeling such that the marks were not apparent without the aid of a microscope or other visual aid. These marks could be formed into serial numbers, company logo's, product information codes, etc. to provide a means to detect theft, tampering, forgeries, and counterfeits of a product. By having secret or hidden labeling information, which cannot be easily removed or altered, traceability of stolen and/or altered products is enhanced. Location of these hidden marks could be more easily detected especially when placed on opaque objects such as engine blocks, computer chassis, audio/video equipment, etc. by incorporating a material which when activated provides a contrast between the mark and the label such as a fluorescent dye in either or both substrate layers, preferably in the underlying transparent substrate. The hidden marks would glow with the fluorescent color when illuminated by a light source such as an ultra-violet lamp, to enhance the contrast of the marks for easy identification by the appropriate authorities.

Also, a larger beam spot size could be used to provide characters that can be read without magnification for use as standard labels that are impervious to abrasion, handling, and atmospheric contamination. In this case, the backing substrate need not be transparent, but can provide a high degree of contrast to enhance visibility.

A cavity is a large opening in a green ceramic sheet, sometimes in a multi-up configuration, which when stacked in a laminate, with other like cavities, forms a recessed pocket for which an integrated circuit is placed. Several tiers are sometimes used to provide spaces for wire bond pads to be placed. These tiers are formed by using cavities of successively smaller dimensions. Wire-bonds are then placed between the integrated circuits and wire-bond pads on the edges of the cavity to form electrical connections. It is apparent that the tolerances required for cavity placement and size are extremely tight. To ensure the cavities meet dimensional and centering tolerances, a line inspection mask is used.

Figure 4:
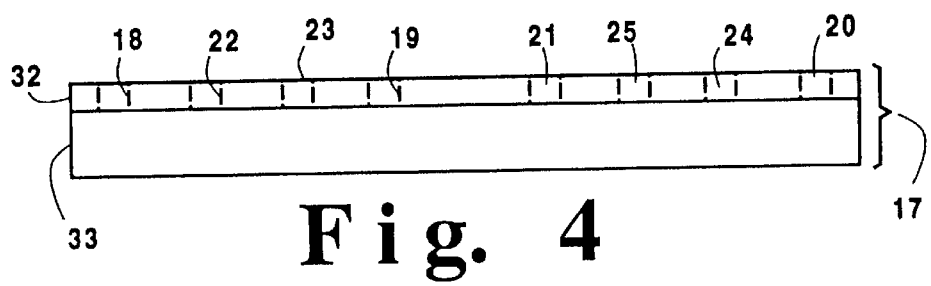
FIG. 4 is a side view of FIG. 3.

A line cavity inspection mask 17 is shown in FIGS. 3 and 4. The mask has a first outer centrality line 18 and a first inner centrality line 19 and intermediate thereto a first outer cavity size line 22 and a first inner cavity size line 23. Likewise, the mask 17 has a second outer centrality line 20 and a second inner centrality line 21 and intermediate thereto a second outer cavity size line 24 and second inner cavity size line 25. The lines correspond to the shape of the cavity to be inspected. FIGS. 3 and 4 illustrate a cavity of extremely small dimensions and is useful in teaching. The advantage of this technique, however, is that it can be used to visually inspect the size, shape and centering accuracies of cavities of very large dimensions, on the scale of several inches, with the same accuracy and ease of use as found with smaller cavities. This will be shown in the following figures. As shown in FIG. 5A the cavity is an elongated opening having parallel sides 30a and 30b. This represents, for example, a lead line on an IC. FIG. 4 is a side view of FIG. 3.

Use of line cavity inspection mask 17 to verify both the cavity size and the position or the centrality of the cavity on the substrate to be inspected is shown by reference to FIGS. 5A, 5A', 5B, 5C and 5D. In using the marks, the lines which appear dark are on the part of the substrate not having a cavity whereas the lines which appear light are positioned over the cavity. This difference between the line shading is used to determine if the centrality and/or size of the cavity is within specification . This provides an easy to use GO/NO GO device.

FIGS. 5A and 5A' shows that both the cavity size and positioning of the cavity on the electronic component 29 are in specification. Thus, cavity edge 30a is between first outer cavity size line 22 and first inner line cavity size 23 and cavity edge 30b is between second outer cavity size line 24 and second inner cavity size line 25. Centrality of the cavity is also verified since the cavity defined by edges 30a and 30b are between first outer centrality line 18 and second outer centrality line 20. FIG. 5A' shows that lines 18 and 22 and 20 and 24 are above the surface of components 29 and therefore appear dark since no light enters these openings (lines) as through openings (lines) 23, 19, 21 and 25. This provides a visual means for using mask 17.

Figure 5B:
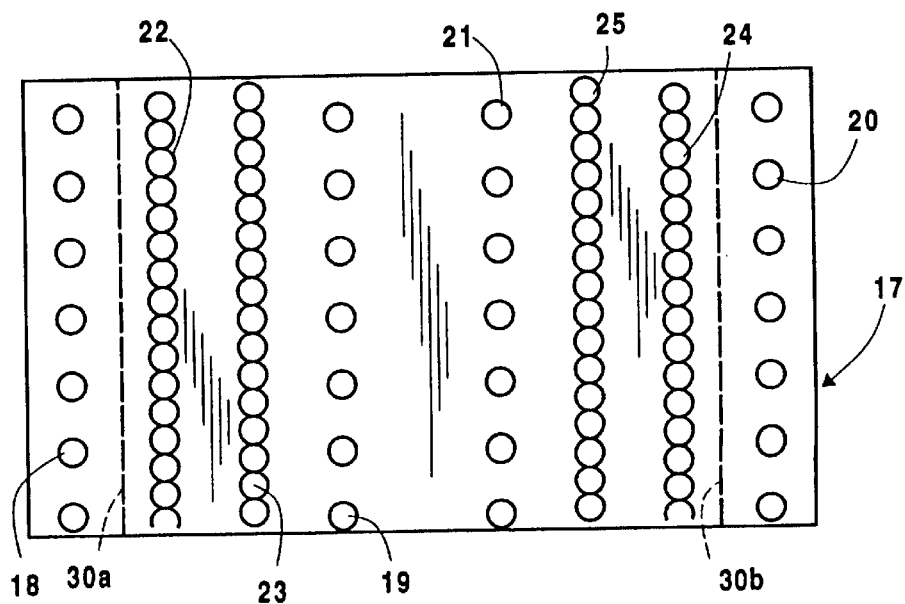
FIGS. 5A, 5B, 5C and 5D are top magnified views showing use of the cavity inspection mask of 3A.
Figure 5A:
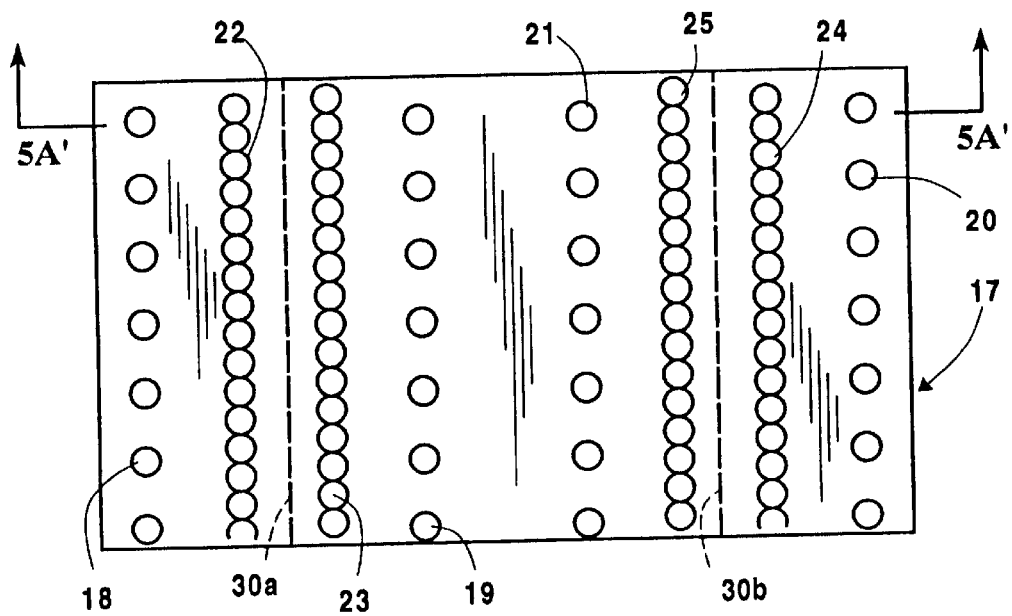
Figure 5A:
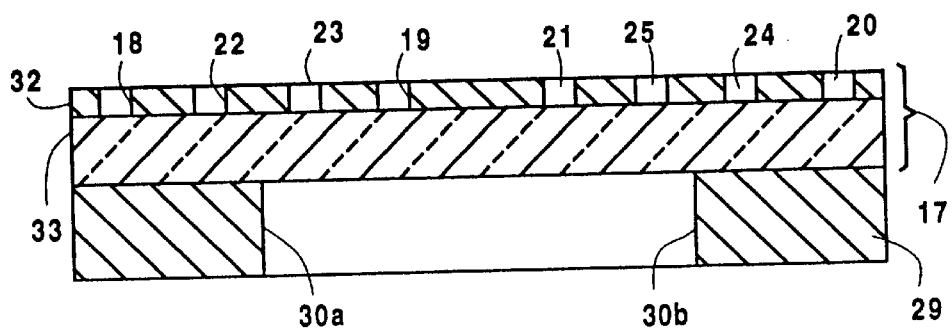

With reference to FIG. 5B, it can be seen that the cavity size as defined by cavity edges 30a and 30b is too large and out of specification since they extend beyond both first outer cavity size line 22 and second outer cavity size line 24. The centrality of the cavity however, is in specification since the cavity edges 30a and 30b lie between first outer centrality line 18 and second outer centrality line 20. Lines formed by openings 18 and 20 would appear dark.

Figure 5C:
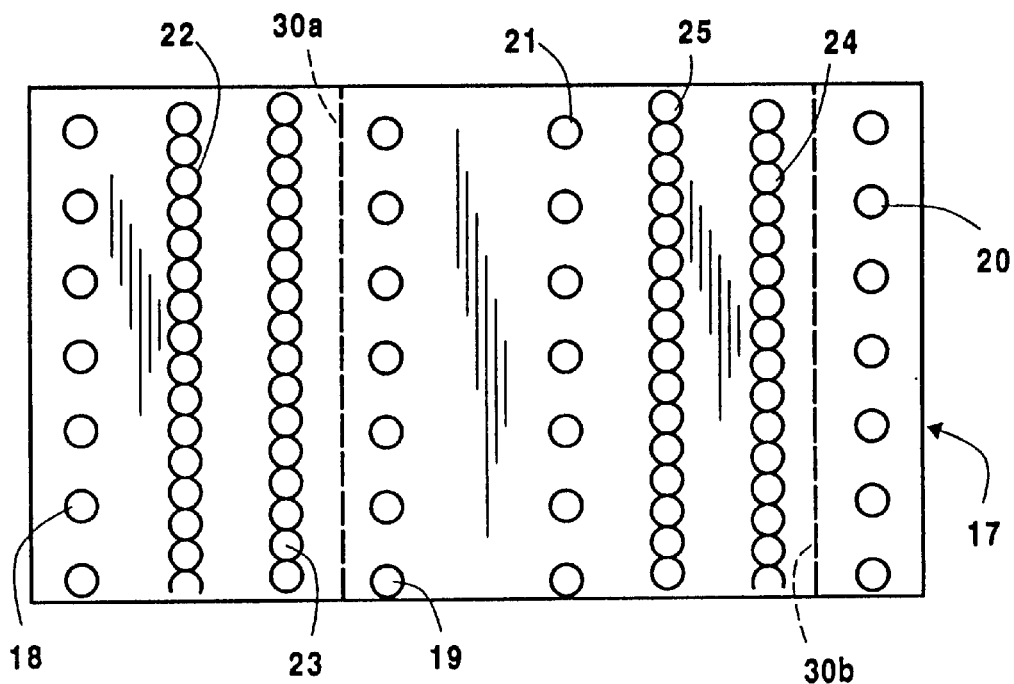

In FIG. 5C, it is shown that both the cavity size and the centrality of the cavity are in specification. This is determined by cavity edge 30a being within first outer centrality line 18 and first inner centrality line 19 and edge 30b being within second outer centrality line 20 and second inner centrality line 21. The cavity size is considered to be in specification by cavity edges 30a and 30b being adjacent to first inner cavity size line 23 and second outer size cavity line 24.

Figure 5D:
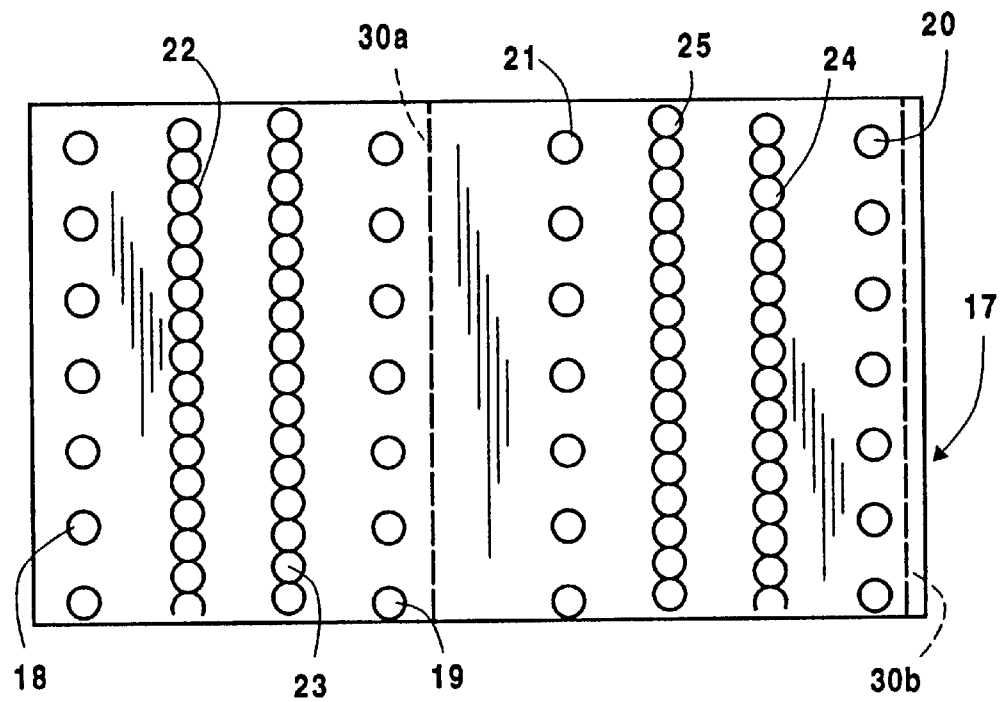

In FIG. 5D, the cavity defined by edges 30a and 30b for the cavity size and cavity centrality are both out of specification. The cavity size can not be determined because lines 18, 22, 23 and 19 are not visible. The cavity centrality likewise is out of specification since the first outer centrality line 18 and first inner centrality line 19 are both not visible.

Other inspection mask designs can be employed to determine cavity size and cavity centrality as will be appreciated by those skilled in the art.

An exposure mask having an exposure pattern forming layer and exposure mask pattern lines thereon may be formed similarly to the process used to make lines 22 for the cavity mask of FIG. 5A in the desired pattern.

The masks of the invention may be made using a wide variety of laser beams and laser beam machining techniques and apparatus. Basically, a laser beam will be directed at particular points or areas on a transparent substrate having a laser absorbing layer coated thereon and the laser beam will selectively etch the laser pattern forming layer at the point of contact with the laser beam to form a transparent pattern area.

U.S. Pat. No. 5,168,454, which patent is hereby incorporated by reference, shows an apparatus and method for accurately and rapidly machining a work piece by using a high powered pulsed Nd:YAG laser. The machining apparatus includes a high energy machining beam, a low energy positioning and verifying beam, collinearly joining the low energy and high energy beams, rapidly scanning the collinear beam along a first axis, means for translating a workpiece along a second orthogonal axis, partially separating the beams, determining the location at which the high energy beam will impinge upon the work piece and thereafter positioning the high energy beam and utilizing the separated low energy beam and in-process computer means for verifying the accuracy of the machining operation. One of the primary functions of the machining apparatus of the patent is to drill a plurality of small, closely spaced holes and the apparatus could be used to make a via inspection mask of the invention. The apparatus and method can also be used to machine features in a substrate other than holes such as slots which are a series of connecting holes machined in a straight line to form the slot. The apparatus and method of U.S. Pat No. 5,168,454 utilizes a computer to store the desired design configuration to be machined on the substrate and to operate the laser apparatus to make the desired pattern substrate.

Other similar apparatus and methods for accurately and rapidly machining or directing a laser beam at a surface work piece may be use to produce the masks of the invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An article of manufacture containing an identifying mark thereon which article is produced by etching the identifying mark in the article by a laser beam comprising:

a first transparent substrate layer which is substantially unaffected by the laser beam;

an intermediate opaque pattern forming layer on the first transparent substrate layer, which intermediate opaque pattern forming layer is a material which absorbs the laser beam and which is etched by contact with the laser beam to form openings in the intermediate opaque pattern forming layer forming an identifying mark in the intermediate opaque pattern forming layer which identifying mark cannot be seen with the unaided eye; and a second transparent substrate layer positioned on the intermediate opaque pattern forming layer;

wherein either the first transparent substrate layer, second transparent substrate layer or both first transparent substrate layer and second transparent substrate layer contains a material which when activated provides a contrast between the identifying mark and the article so that the mark can easily be read.

2. The article of claim 1 wherein the first transparent substrate layer contains a material which when activated provides a contrast between the mark and the article so that the mark can easily be read.

3. The article of claim 2 wherein the material is a fluorescent dye.

4. The article of claim 1 wherein said both transparent substrate layers contain a material which when activated provides a contrast between the identifying mark and the article so that the mark can easily be read.

5. The article of claim 4 wherein the material is a fluorescent dye.

6. The article of claim 1 wherein the second transparent substrate layer contains a material which when activated provides a contrast between the identifying mask and the article so that the mask can easily be read.

7. The article of claim 6 wherein the material is a fluorescent dye.

* * * * *